(12) United States Patent
Shenouda

(10) Patent No.: US 12,126,161 B2
(45) Date of Patent: Oct. 22, 2024

(54) FUSIBLE LINK FOR ARC DETECTION

(71) Applicant: Pratt & Whitney Canada Corp., Québec (CA)

(72) Inventor: Antwan Shenouda, Mississauga (CA)

(73) Assignee: PRATT & WHITNEY CANADA CORP., Québec (CA)

( * ) Notice: Subject to any disclaimer, the term of this patent is extended or adjusted under 35 U.S.C. 154(b) by 0 days.

(21) Appl. No.: 18/180,550

(22) Filed: Mar. 8, 2023

(65) Prior Publication Data

US 2024/0305084 A1    Sep. 12, 2024

(51) Int. Cl.
H02H 1/00    (2006.01)
H01H 85/22    (2006.01)
H02B 1/18    (2006.01)
H02H 7/22    (2006.01)
H01H 83/20    (2006.01)

(52) U.S. Cl.
CPC .......... *H02H 1/0023* (2013.01); *H01H 85/22* (2013.01); *H02B 1/18* (2013.01); *H02H 7/22* (2013.01); *H01H 2083/201* (2013.01)

(58) Field of Classification Search
CPC ........ H02H 1/0023; H02H 7/22; H01H 85/22; H01H 2083/201; H02B 1/18
USPC .......................................................... 361/2
See application file for complete search history.

(56) References Cited

U.S. PATENT DOCUMENTS

| | | | |
|---|---|---|---|
| 4,658,322 A | 4/1987 | Rivera | |
| 6,377,427 B1 | 4/2002 | Haun et al. | |
| 8,054,594 B2 | 11/2011 | Wu et al. | |
| 9,966,675 B2 | 5/2018 | Wortberg et al. | |
| 10,193,331 B2 | 1/2019 | Kilroy et al. | |
| 10,658,833 B2 | 5/2020 | Galin et al. | |
| 11,165,241 B2 | 11/2021 | Galin et al. | |
| 11,652,351 B2 | 5/2023 | Galin et al. | |
| 2008/0225445 A1 | 9/2008 | Cheng et al. | |
| 2012/0194317 A1 * | 8/2012 | Vranicar | H01H 37/761 337/401 |

(Continued)

FOREIGN PATENT DOCUMENTS

| | | | |
|---|---|---|---|
| CA | 2869805 C | 5/2017 | |
| DE | 19631088 A1 * | 3/1997 | ........... H02B 13/065 |

(Continued)

OTHER PUBLICATIONS

Machine translation of Sorg German Patent Document DE 19631088 A1 Mar. 1997 (Year: 1997).*

(Continued)

*Primary Examiner* — Kevin J Comber
(74) *Attorney, Agent, or Firm* — CANTOR COLBURN LLP

(57) ABSTRACT

An arc detection assembly is provided and includes first and second conductors including first and second terminal ends, respectively, which are engageable to form an electrical connection and an arc detection system. The arc detection system includes a fusible link disposed proximate to one of the first and second terminal ends and configured to break in response to an arcing condition between the first and second terminal ends and a monitoring circuit coupled to the fusible link and configured to determine when breakage of the fusible link occurs and to thereby determine that the arcing condition has occurred.

14 Claims, 5 Drawing Sheets

(56) References Cited

U.S. PATENT DOCUMENTS

2017/0358920 A1* 12/2017 Galin .................. H02J 7/35
2023/0059046 A1    2/2023 Khozikov et al.

FOREIGN PATENT DOCUMENTS

DE    102016111690 A1   12/2016
FR        2803445 A1    7/2001

OTHER PUBLICATIONS

Search Report issued in European Patent Application No. 24161875.0; Application Filing Date Mar. 6, 2024; Date of Mailing Jul. 12, 2024 (5 pages).

* cited by examiner

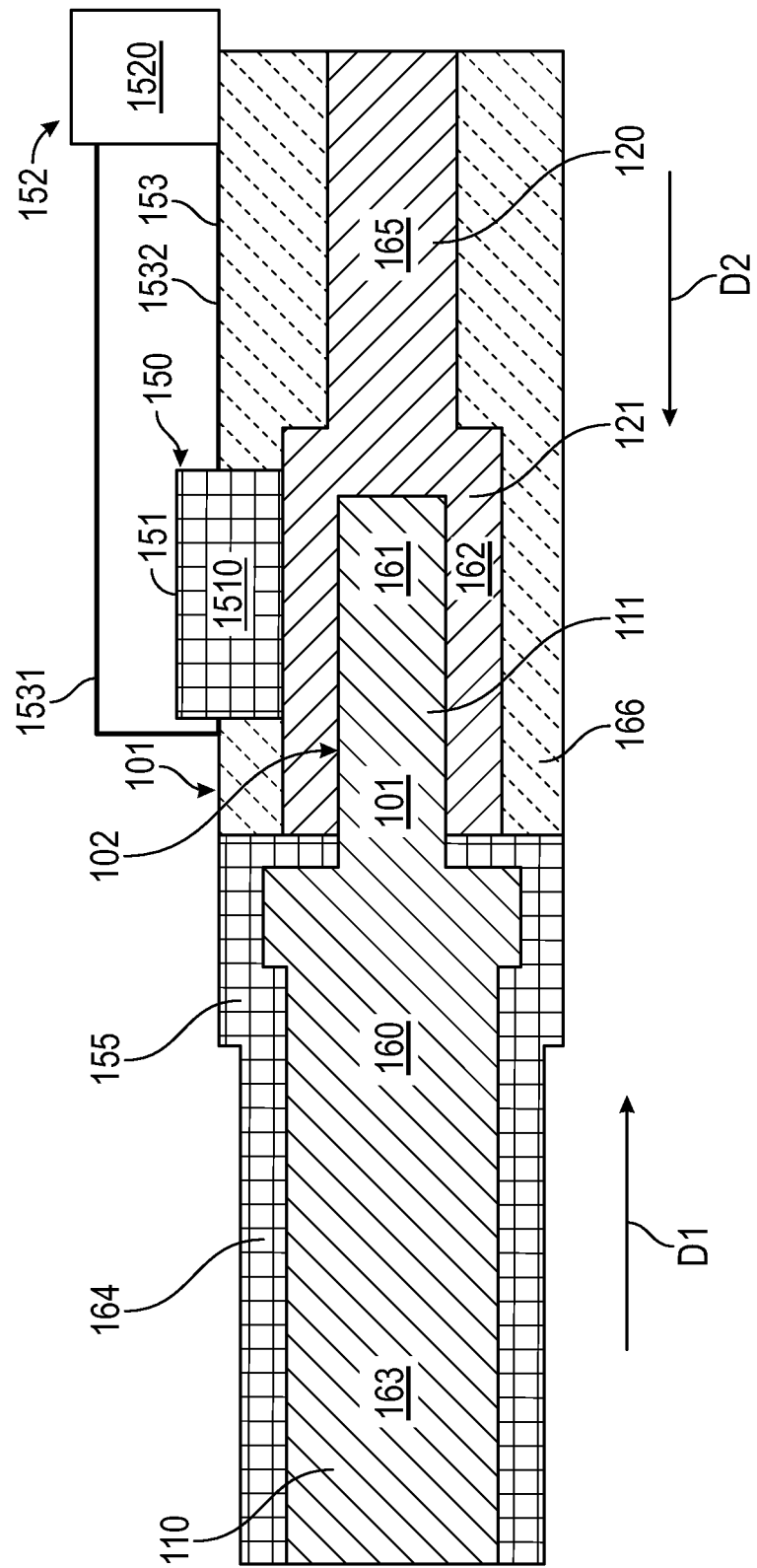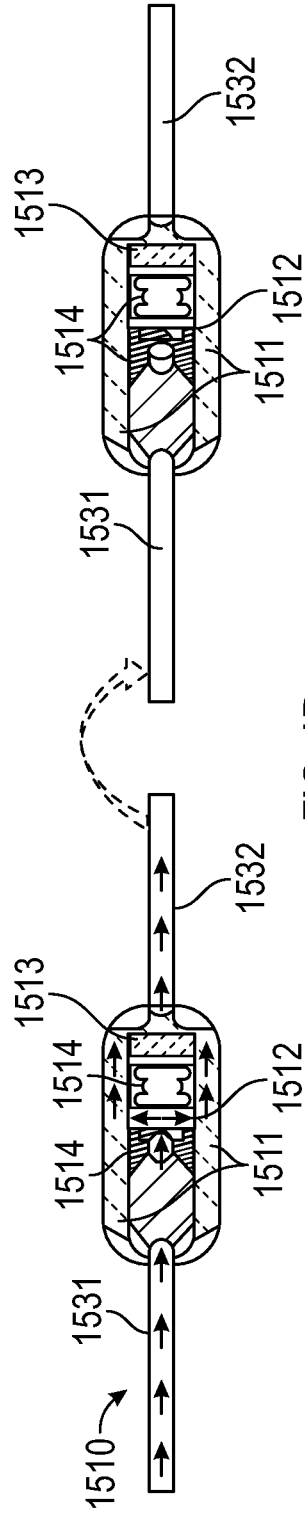
FIG. 1A
FIG. 1B

FUSIBLE LINK FOR ARC DETECTION

BACKGROUND

The present disclosure relates to arc detection and, in particular, to a fusible link for arc detection.

An arc fault is a high-power discharge of electricity between two or more conductors. This discharge generates heat, which can break down the wire's insulation and trigger an electrical fire. Arc faults can range in current from a few amps up to thousands of amps, and are highly variable in strength and duration.

SUMMARY

According to an aspect of the disclosure, an arc detection assembly is provided and includes first and second conductors including first and second terminal ends, respectively, which are engageable to form an electrical connection and an arc detection system. The arc detection system includes a fusible link disposed proximate to one of the first and second terminal ends and configured to break in response to an arcing condition between the first and second terminal ends and a monitoring circuit coupled to the fusible link and configured to determine when breakage of the fusible link occurs and to thereby determine that the arcing condition has occurred.

In accordance with additional or alternative embodiments, the first and second terminal ends are engageable in at least one of a pin-and-socket formation and a terminal lug formation.

In accordance with additional or alternative embodiments, the fusible link includes a cut-off fuse interposed between input and output lines. At low temperatures of the fusible link below temperatures associated with the arcing condition, the cut-off fuse permits electricity to be conducted from the input line to the output line and at high temperatures of the fusible link above the temperatures associated with the arcing condition, breakage of the cut-off fuse prevents conduction of the electricity from the input line to the output line.

In accordance with additional or alternative embodiments, the cut-off fuse includes a housing, a spring-loaded slider disposed in the housing to assume one of a first position, at which the electricity is conducted from the input line to the output line via the spring-loaded slider, and a breakage position, at which the conduction of the electricity from the input line to the output line is prevented and a thermal pallet, which normally maintains the spring-loaded slider in the first position at the low temperatures of the fusible link and which permits movement of the spring-loaded slider into the breakage position at the high temperatures of the fusible link.

In accordance with additional or alternative embodiments, the monitoring circuit includes a controller configured to identify and interrupt a current causing the arcing condition and to issue a warning that the arcing condition occurred and an electrical device configured to open a circuit carrying the current responsive to an interrupt signal issued by the controller.

In accordance with additional or alternative embodiments, the monitoring circuit includes input and output lines routed along and through at least one of the first and second conductors and by which the fusible link and the monitoring circuit are communicative.

In accordance with additional or alternative embodiments, the monitoring circuit includes input and output lines routed along an exterior of at least one of the first and second conductors and by which the fusible link and the monitoring circuit are communicative.

According to an aspect of the disclosure, an arc detection assembly is provided and includes electrical connection elements and an arc detection system. Each electrical connection element includes first and second conductors including first and second terminal ends, respectively, which are engageable to form an electrical connection. The arc detection system includes fusible links disposed proximate to one of the first and second terminal ends of each electrical connection element and configured to break in response to an arcing condition between the corresponding first and second terminal ends, a monitoring circuit coupled to the fusible links and configured to determine when breakage of any of the fusible links occurs and to thereby determine that the arcing condition has occurred and input and output line circuitry routed along at least one of the first and second conductors of each electrical connection element and by which each fusible link and the monitoring circuit are communicative.

In accordance with additional or alternative embodiments, the first and second terminal ends in at least one of the electrical connection elements are engageable in at least one of a pin-and-socket formation and a terminal lug formation.

In accordance with additional or alternative embodiments, each fusible link includes a cut-off fuse interposed between input and output lines. At low temperatures of the fusible link below temperatures associated with the arcing condition, the cut-off fuse permits electricity to be conducted from the input line to the output line and at high temperatures of the fusible link above the temperatures associated with the arcing condition, breakage of the cut-off fuse prevents conduction of the electricity from the input line to the output line.

In accordance with additional or alternative embodiments, the cut-off fuse includes a housing, a spring-loaded slider disposed in the housing to assume one of a first position, at which the electricity is conducted from the input line to the output line via the spring-loaded slider, and a breakage position, at which the conduction of the electricity from the input line to the output line is prevented and a thermal pallet, which normally maintains the spring-loaded slider in the first position at the low temperatures of the fusible link and which permits movement of the spring-loaded slider into the breakage position at the high temperatures of the fusible link.

In accordance with additional or alternative embodiments, the monitoring circuit includes a controller configured to identify and interrupt a current causing the arcing condition and to issue a warning that the arcing condition occurred and an electrical device configured to open a circuit carrying the current responsive to an interrupt signal issued by the controller.

In accordance with additional or alternative embodiments, the input and output line circuitry is routed along and through the at least one of the first and second conductors or along an exterior of the at least one of the first and second conductors.

According to an aspect of the disclosure, an arc detection assembly is provided and includes electrical connection elements and an arc detection system. Each electrical connection element includes first and second conductors including first and second terminal ends, respectively, which are engageable to form an electrical connection. The arc detection system includes fusible links disposed proximate to one of the first and second terminal ends of each electrical connection element and configured to break in response to an arcing condition between the corresponding first and second terminal ends and a monitoring circuit coupled to the fusible links and configured to determine when breakage of any of the fusible links occurs and to thereby determine that the arcing condition has occurred.

In accordance with additional or alternative embodiments, the first and second terminal ends in at least one of the electrical connection elements are engageable in at least one of a pin-and-socket formation and a terminal lug formation.

In accordance with additional or alternative embodiments, each fusible link includes a cut-off fuse interposed between input and output lines. At low temperatures of the fusible link below temperatures associated with the arcing condition, the cut-off fuse permits electricity to be conducted from the input line to the output line and at high temperatures of the fusible link above the temperatures associated with the arcing condition, breakage of the cut-off fuse prevents conduction of the electricity from the input line to the output line.

In accordance with additional or alternative embodiments, the cut-off fuse includes a housing, a spring-loaded slider disposed in the housing to assume one of a first position, at which the electricity is conducted from the input line to the output line via the spring-loaded slider, and a breakage position, at which the conduction of the electricity from the input line to the output line is prevented and a thermal pallet, which normally maintains the spring-loaded slider in the first position at the low temperatures of the fusible link and which permits movement of the spring-loaded slider into the breakage position at the high temperatures of the fusible link.

In accordance with additional or alternative embodiments, the monitoring circuit includes a controller configured to identify and interrupt a current causing the arcing condition and to issue a warning that the arcing condition occurred and an electrical device configured to open a circuit carrying the current responsive to an interrupt signal issued by the controller.

In accordance with additional or alternative embodiments, the arc detection system further includes input and output line circuitry connected to each of the fusible links and the input and output line circuitry includes input and output lines connected to each of the fusible links and routed along at least one of the corresponding first and second conductors.

In accordance with additional or alternative embodiments, each of the fusible links is communicative with a same channel of the monitoring circuit by way of the corresponding input and output lines.

Additional features and advantages are realized through the techniques of the present disclosure. Other embodiments and aspects of the disclosure are described in detail herein and are considered a part of the claimed technical concept. For a better understanding of the disclosure with the advantages and the features, refer to the description and to the drawings.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts:

FIGS. 1A and 1B are schematic side views of an arc detection assembly and a pin-and-socket formation in accordance with embodiments;

DETAILED DESCRIPTION

Figure 2:
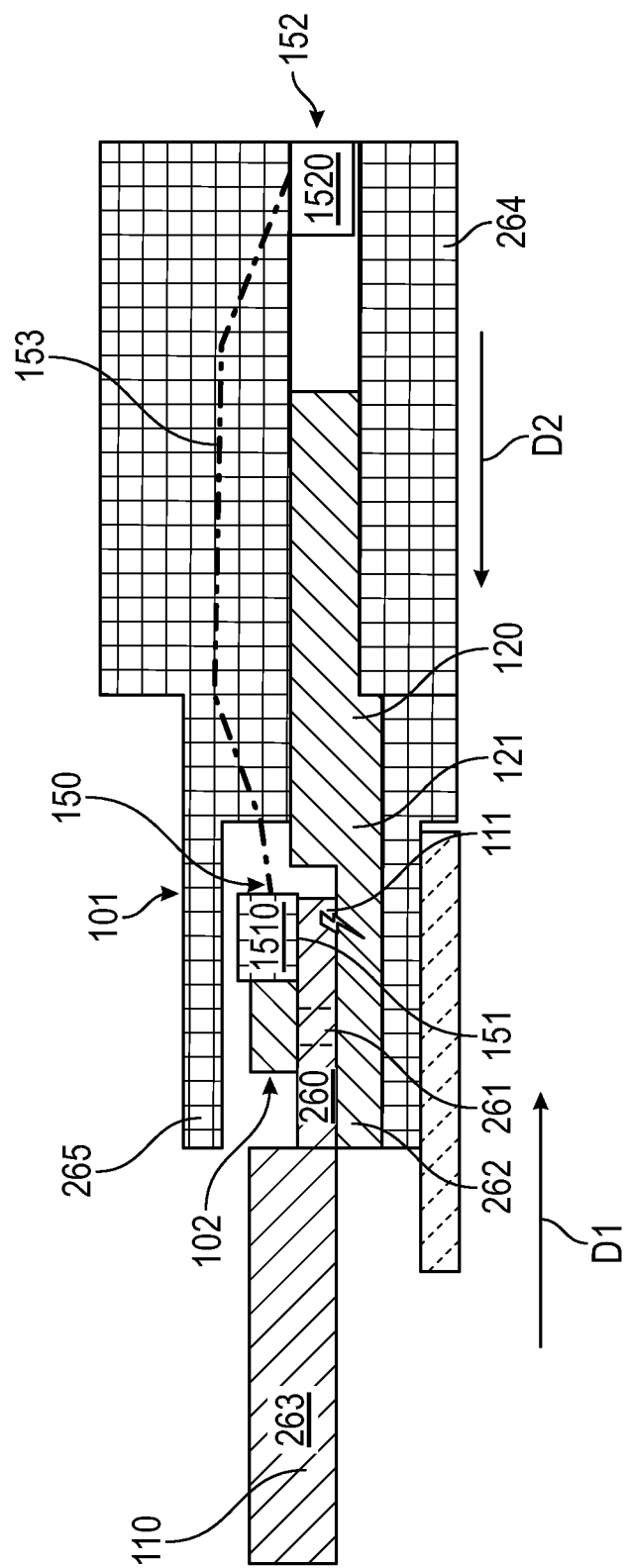
FIG. 2 is a schematic side view of an arc detection assembly and a bolt and busbar combination formation in accordance with embodiments.

A parallel arc occurs when electricity intermittently jumps a gap between wires of different voltages, such as line-to-line (i.e., two hot conductors of different phases), line-to-neutral or line-to-ground. An example of what may cause a parallel arc is contamination that bridges the gap between two parallel lines of different voltages, or if damage occurs on the insulation of two parallel lines carrying different voltages, where the damaged lines are close enough together, an arc may occur between the exposed wires. Since parallel arcs occur between conductors at different voltages, the amount of current can vary widely, from very little to a very high amount up to the short circuit current available for that circuit. A series arc occurs when electricity intermittently jumps a gap between two or more points within the same phase. An example of what may cause a series arc is when a pin and socket connection are not tightly fit, or connection may intermittently break due to vibration, etc.

An airgap distance that an arc can jump depends on the voltage and the altitude (resulting air pressure). The lower the altitude, and the higher the voltage, the larger the distance that the arc can jump.

Arcs can also occur when a nonconductive medium, such as air, breaks down and creates an electrical path from a high energy source and a lower energy sink. An AC arc can be cleared easier than a DC gap because the current and voltage are forced to go through zero multiple times a second (depending on the frequency). DC arcs can be sustained at much larger distances from the original distance at formation because a conductive channel is formed once the arc is created.

Current methods of arc detection include electromagnetic interference (EMI) detection, audio detection, current signature analysis and optical detection. The present methods generally attempt to isolate an arc signature (audio, optical, EMI or current) from the surrounding environment. This can prove to be very difficult for high voltage/power lines because the current flowing in the cables and the surrounding equipment can contribute significant noise. For example, the current in a conductor driving a motor can be very noisy electrically because of multiple factors, such as high-power switching. Optical detection methods suffer from the fact that, while light travels in straight lines, light is relatively easily attenuated. As such, optical detection methods often require multiple optical sensors and a completely dark environment to be able to detect arcing.

Therefore, there remains a need for simple and reliable methods and systems for detecting high impedance arcing.

As will be described below, arc detection in a semi-enclosed or enclosed space, such as an electronic box or a terminal box, is provided by an addition of a fusible link to potential arc sources. The fusible link can be configured to break due to arcing and can be connected to a monitoring circuit which monitors breakage of the fusible link. This allows for the detection of parallel arcs as well as serial arcs, which occur between serially connected conductors and which are often very difficult to detect.

With reference to FIG. 1A, an arc detection assembly 101 is provided and includes a first conductor 110 that includes a first terminal end 111, a second conductor 120 that includes a second terminal end 121 and an arc detection system 150. An enclosure 155 can be formed to fully or at least partially enclose a space in which the first and second terminal ends 111 and 121 are engageable with one another to form an electrical connection 102 by which current is conducted from the first conductor 110 to the second conductor 120 (or vice versa; for purposes of clarity and brevity, unless otherwise noted, the following description will relate to cases in which current is conducted from the first conductor 110 to the second conductor 120).

The arc detection system 150 is configured to sense, detect and, in some cases, mitigate an arcing condition occurring between the first conductor 110 and the second conductor 120. In particular, the arc detection system 150 is configured to sense, detect and, in some cases, mitigate an arcing condition occurring between the first terminal end 111 and the second terminal end 121 as the first and second terminal ends 111 and 121 engage to form the electrical connection 102 or while the first and second terminal ends 111 and 121 are engaged.

With continued reference to FIG. 1A and with additional reference to FIG. 1B, the arc detection system 150 includes a fusible link 151, a temperature monitoring circuit 152 and input and output line circuitry 153.

The fusible link 151 is disposable proximate to an engagement of the first and second terminal ends 111 and 121 such that a temperature increase due to arcing is felt and sensed by the fusible link 151. The fusible link 151 can include a cut-off fuse 1510 that is interposed between an input line 1531 and an output line 1532 of the input and output line circuitry 153. At low temperatures of the fusible link 151, which are characterized as being below temperatures associated with an occurrence of the arcing condition between the first and second terminal ends 111 and 121, the cut-off fuse 1510 permits electricity to be conducted from the input line 1531 to the output line 1532. At high temperatures of the fusible link 151, which are characterized as being above the temperatures associated with the occurrence of the arcing condition between the first and second terminal ends 111 and 121, breakage of the cut-off fuse 1510 prevents conduction of the electricity from the input line 1531 to the output line 1532.

As shown in FIG. 1B, the cut-off fuse 1510 can include a housing 1511, a spring-loaded slider 1512 and a thermal pallet 1513. The spring-loaded slider 1512 is disposed in the housing 1511 to assume one of a first position and a breakage position. The first position is characterized as a position of the spring-loaded slider 1512 within the housing 1511 at which the electricity is conducted from the input line 1531 to the output line 1532 via the spring-loaded slider 1512. The breakage position is characterized as a position of the spring-loaded slider 1512 at which the conduction of the electricity from the input line 1531 to the output line 1532 is prevented. The thermal pallet 1513 normally maintains the spring-loaded slider 1512 in the first position at the low temperatures of the fusible link 151 and permits movement of the spring-loaded slider 1512 into the breakage position at the high temperatures of the fusible link 151. In an exemplary case, the thermal pallet 1513 can be formed of material that has a relatively large initial volume at the low temperatures of the fusible link 151 and melts and decreases in volume at the high temperatures of the fusible link 151. When the thermal pallet 1513 has the initial volume, the thermal pallet 1513 holds the spring-loaded slider 1512 in the first position against a bias of elastic element 1514 that are anchored in the housing 1511. When the thermal pallet 1513 has the decreased volume, the elastic elements 1514 force the spring-loaded slider 1512 into the breakage position.

The monitoring circuit 152 is operably coupled to and communicative with the fusible link 151 by way of the input and output line circuitry 153. The input and output line circuitry 153 can be routed along and, in some cases, through at least one of the first and second conductors 110 and 120. In other cases, the input and output line circuitry 153 can be routed along an exterior of the first and second conductors 110 and 120. The monitoring circuit 152 is configured to determine when breakage of the fusible link 151 occurs (i.e., when the spring-loaded slider 1512 moves to the breakage position) and to thereby determine that the arcing condition has occurred. The monitoring circuit 152 can include a controller 1520. The controller 1520 can include a memory unit, a processor and an input/output (I/O) unit by which the processor is communicative with the fusible link 151 and with an external device. The memory unit has executable instructions stored thereon, which are readable and executable by the processor. When the executable instructions are read and executable by the processor, the processor is caused to operate as described herein.

When an arc occurs or is about to occur between the first and second conductors 110 and 120 and/or between the first and second terminal ends 111 and 121, the arc or the potential arc (i.e., the local impedance) tends to increase a temperature of the various components in an around the electrical connection 102 and the fusible link 151 effectively senses this temperature increase caused by the arc or the potential arc. This causes the spring-loaded slider 1512 to move to the breakage position and prevents the conduction of the electricity from the input line 1531 to the output line 1532, which is felt by the monitoring circuit 152 whereby the monitoring circuit 152 determines when/whether breakage of the fusible link 151 and therefore an arcing condition has occurred.

If it is determined that no arc has occurred, the controller 1520 of the monitoring circuit 152 may take no action. If it is determined that the arcing condition has occurred, the controller 1520 of the monitoring circuit 152 may take one or more actions. These include, but are not limited to, identifying a current that is responsible for causing the arcing condition (i.e., by identifying the fusible link 151 and recognizing that the fusible link 151 may be associated with a given current), interrupting the current and issuing a warning that the arcing condition occurred to the external device or to an operator for example.

With continued reference to FIG. 1 and with additional reference to FIG. 2, the first and second terminal ends 111 and 121 can be engageable in at least one of a pin-and-socket formation 160 (see FIG. 1) and a terminal lug formation 260 (see FIG. 2).

As shown in FIG. 1, the pin-and-socket formation 160 can be characterized in that the first terminal end 111 is provided as one or more pins 161 and in that the second terminal end 121 is provided as one or more sockets 162 (for purposes of clarity and brevity, the following description will relate to the case in which the first terminal end 111 is provided as a single pin 161 and the second terminal end 121 is provided as a single socket 162). The pin 161 extends from a connector element 163 (i.e., the first conductor 110) in a first direction D1 and the connector element 163 includes an outer sheath 164. The socket 162 extends from a cable 165 (i.e., the second conductor 120) in a second direction D2, which is opposite the first direction D1. The cable 165 can include an outer sheath 166 as well. The socket 162 is formed to tightly fit around the pin 161. In this case, the fusible link 151 can be disposable proximate to or in direct thermal contact with the socket 162. The input and output circuitry 153 can be routed from the fusible link 151 and around an exterior of the outer sheath 166.

As shown in FIG. 2, the terminal lug formation 260 can be characterized in that the first terminal end 111 is provided as a terminal lug 261 and in that the second terminal end 121 is provided as a bolt and busbar combination 262 in which a bolt secures the terminal lug 261 to a busbar so that the terminal lug 261 is electrically connected with at least the busbar. The terminal lug 261 extends from a cable 263 (i.e., the first conductor 110) in a first direction D1. The bolt and busbar combination 262 is electrically connected to an electronic unit 264 (i.e., the second conductor 120) and in a second direction D2, which is opposite the first direction D1. A backshell 265 generally surrounds the terminal lug 261 and the bolt and busbar combination 262. In this case, the fusible link 151 can be disposable proximate to or in direct thermal contact with the bolt and busbar combination 262. The input and output circuitry 153 can be routed from the fusible link 151.

Figure 3:
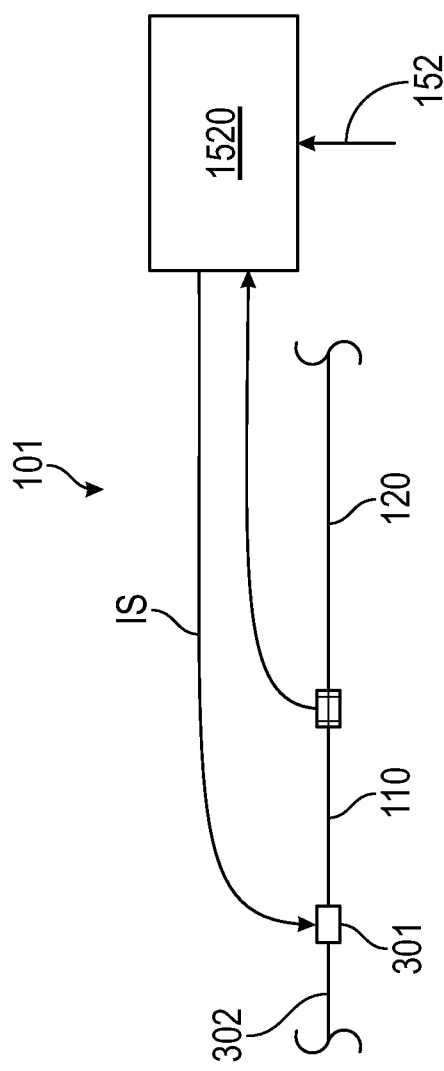
FIG. 3 is a circuit diagram including a controller and an electrical device of an arc detection assembly in accordance with embodiments.

With reference to FIG. 3, with the controller 1520 of the monitoring circuit 152 being configured to identify and interrupt a current causing the arcing condition and to issue a warning that the arcing condition occurred, the arc detection assembly 101 can further include an electrical device 301. The electrical device 301 can include or be provided as a contactor, a relay, a switch, etc. In any case, the electrical device 301 is configured to open a circuit 302 carrying the current in response to an interrupt signal IS issued by the controller 152.

The following further descriptions of the arc detection assembly 101 will generally relate to the embodiments of FIG. 1 in which the first and second terminal ends 111 and 121 are engageable in the pin-and-socket formation 160 and elements and features that have already been described will not be re-described in detail. This is being done for purposes of clarity and brevity.

Figure 4:
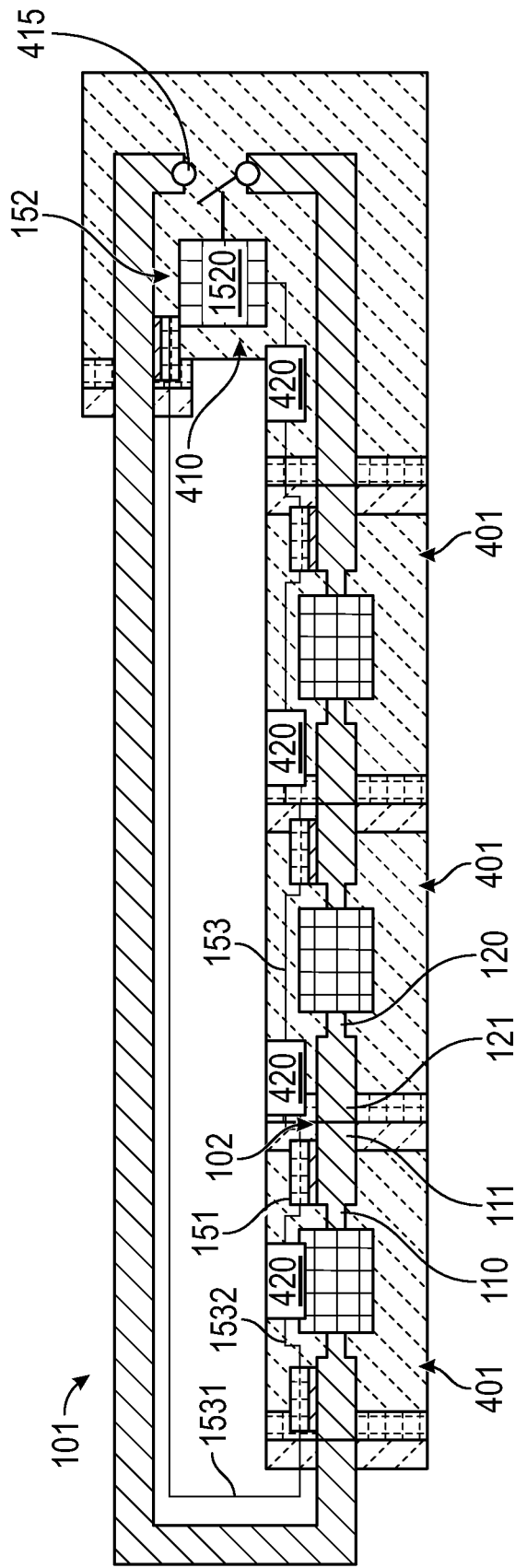
FIG. 4 is a schematic side view of the arc detection assembly of FIG. 1 with multiple electrical connections in a pin-and-socket formation in accordance with embodiments.

With reference to FIG. 4, the arc detection assembly 101 can include multiple electrical connection elements 401, an arc detection system 410 and an electrical device 415 that is similar to the electrical device 301 of FIG. 3. Each of the multiple electrical connection elements 401 includes first and second conductors 110 and 120 that each include first and second terminal ends 111 and 121, respectively, which are engageable to form an electrical connection 102. The arc detection system 410 includes fusible links 151 of each electrical connection element 401, a monitoring circuit 152 and input and output circuitry 153. The monitoring circuit 152 is coupled to each of the fusible links 151 and is configured to determine when/whether breakage of any of the fusible links 151 occurs and thus when/whether an arc of the corresponding electrical connection 102 occurs. The input and output circuitry 153 can be routed along (i.e., through or at an exterior of) at least one of the first and second conductors 110 and 120 of each of the electrical connection elements 401. Each of the fusible links 151 and the monitoring circuit 152 are communicative by way of the input and output circuitry 153.

In accordance with embodiments, the fusible links 151 can be daisy chained together such that, a failure of any one of the fusible links 151, can trigger a mitigation or accommodation.

As shown in FIG. 4, the arc detection assembly 101 can further include electrical elements 420 that are electrically interposed between the input and output circuitry 153 and a corresponding one of the fusible links 151. Each of the electrical elements 420 can be provided as a filter or a similar device and is configured to identify the corresponding one of the fusible links 151 to the monitoring circuit 152 and the controller 1520.

Figure 5:
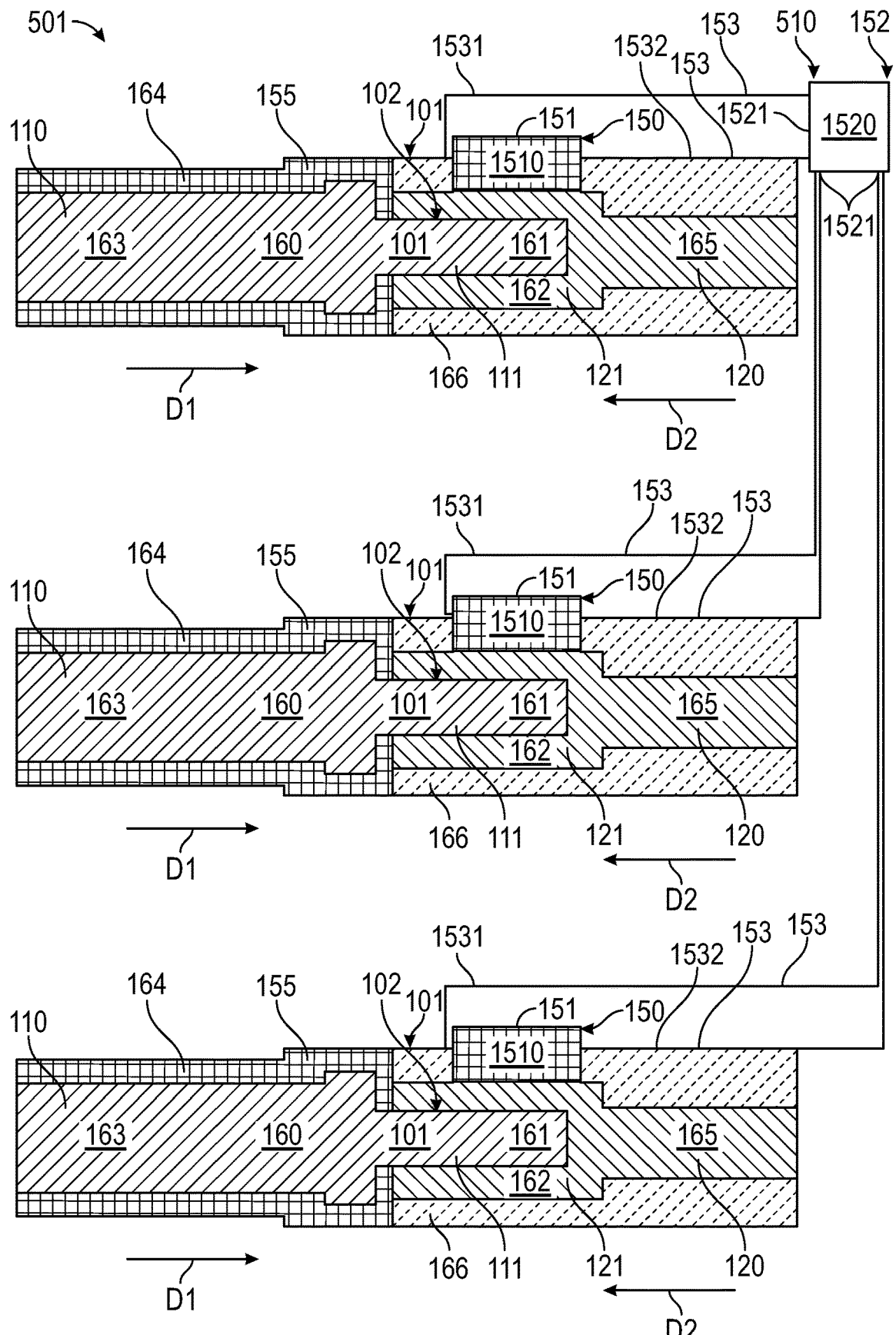
FIG. 5 is a schematic side view of the arc detection assembly of FIG. 1 with multiple electrical connections in a pin-and-socket formation and a fiber optic cable in accordance with embodiments.

With reference to FIG. 5, the arc detection assembly 101 can include multiple electrical connection elements 501 and an arc detection system 510. Each of the multiple electrical connection elements 501 includes first and second conductors 110 and 120 that each include first and second terminal ends 111 and 121, respectively, which are engageable to form an electrical connection 102. The arc detection system 510 includes fusible links 151 of each electrical connection element 501, a monitoring circuit 152 and one or more cables 153. The monitoring circuit 152 is coupled to each of the fusible links 151 and is configured to determine when/whether breakage of any of the fusible links 151 occurs and thus when/whether an arcing condition of the corresponding electrical connection 102 occurs. The input and output circuitry 153 can be routed along (i.e., through or at an exterior of) at least one of the first and second conductors 110 and 120 of each of the electrical connection elements 501. Each of the fusible links 151 and the monitoring circuit 152 are communicative by way of the input and output circuitry 153. As shown in FIG. 5, each of the fusible links 151 is communicative with a unique channel 1521 of the controller 1520 of the monitoring circuit 152 by way of the corresponding input and output circuitry 153.

In accordance with embodiments, the fusible links 151 can be daisy chained together such that, a failure of any one of the fusible links 151, can trigger a mitigation or accommodation.

Figure 6:
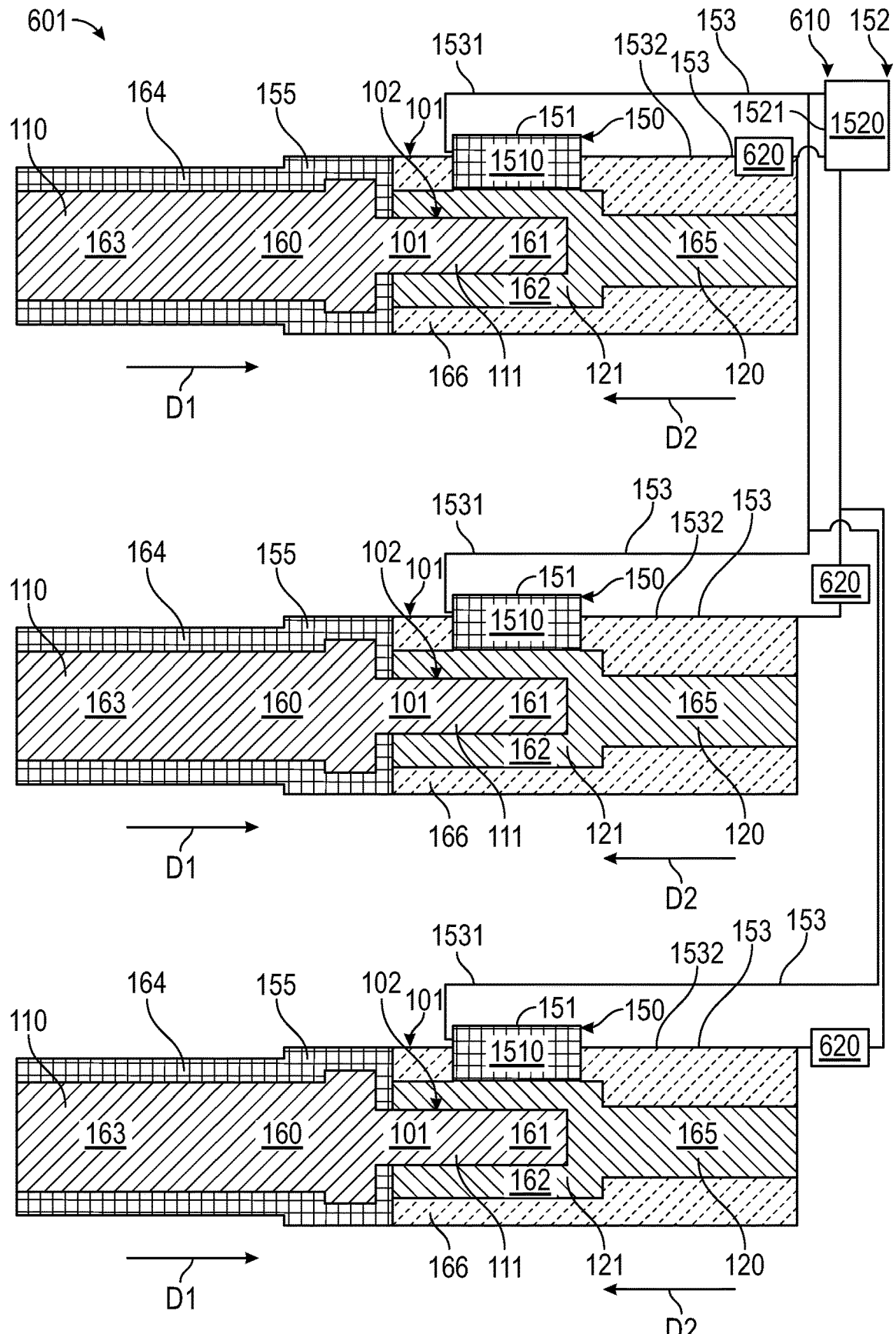
FIG. 6 is a schematic side view of the arc detection assembly of FIG. 1 with multiple electrical connections in a pin-and-socket formation and multiple fiber optic cables in accordance with embodiments.

With reference to FIG. 6, the arc detection assembly 101 can include multiple electrical connections 601 and an arc detection system 610. Each of the multiple electrical connections 601 includes first and second conductors 110 and 120 that each include first and second terminal ends 111 and 121, respectively, and that are engageable to form an electrical connection 102. The arc detection system 610 includes fusible links 151 of each electrical connection element 601, a monitoring circuit 152 and input and output circuitry 153. The monitoring circuit 152 is coupled to each of the fusible links 151 and is configured to determine when/whether breakage of any of the fusible links 151 occurs and thus when/whether an arcing condition of the corresponding electrical connection 102 occurs. The input and output circuitry 153 can be routed along (i.e., through or at an exterior of) at least one of the first and second conductors 110 and 120 of each of the electrical connection elements 601. The input and output circuitry 153 is connected to a same channel 1522 of the controller 1520 of the monitoring circuit 152 and includes an electrical element 620 that is configured to identify the corresponding one of the fusible links 151 to the controller 1520 by operating in a similar manner as the electrical elements 420 described above (see FIG. 4). Only one electrical element 620 is shown in FIG. 6 for clarity and brevity.

In accordance with embodiments, the fusible links 151 can be daisy chained together such that, a failure of any one of the fusible links 151, can trigger a mitigation or accommodation.

Technical effects and benefits of the present disclosure are the provision of arc detection in enclosures in various technologies including, but not limited to, aerospace technologies, industrial boxes, electric vehicles (e.g., trains, boats, submarines, road vehicles and flying vehicles). The arc detection provides herein offers an essential solution in the development of electric and hybrid aircraft to a safety concern that is raised when high-voltages are used especially at high altitudes.

The corresponding structures, materials, acts, and equivalents of all means or step-plus function elements in the claims below are intended to include any structure, material, or act for performing the function in combination with other claimed elements as specifically claimed. The description of the present disclosure has been presented for purposes of illustration and description, but is not intended to be exhaustive or limited to the technical concepts in the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

While the preferred embodiments to the disclosure have been described, it will be understood that those skilled in the art, both now and in the future, may make various improvements and enhancements which fall within the scope of the claims which follow. These claims should be construed to maintain the proper protection for the disclosure first described.

What is claimed is:

1. An arc detection assembly, comprising:
   first and second conductors comprising first and second terminal ends, respectively, which are engageable to form an electrical connection; and
   an arc detection system comprising:
   a fusible link disposed proximate to one of the first and second terminal ends and configured to break in response to an arcing condition between the first and second terminal ends; and
   a monitoring circuit coupled to the fusible link and configured to determine when breakage of the fusible link occurs and to thereby determine that the arcing condition has occurred,
   the fusible link comprising a cut-off fuse, wherein, at low temperatures of the fusible link below temperatures associated with the arcing condition, the cut-off fuse permits electrical conduction, and, at high temperatures of the fusible link above the temperatures associated with the arcing condition, breakage of the cut-off fuse prevents the electrical conduction, and
   wherein the cut-off fuse comprises:
   a spring-loaded slider to assume one of a first position at which the electrical conduction is permitted and a breakage position at which the electrical conduction is prevented; and
   a thermal pallet formed of material having a large initial volume to normally maintain the spring-loaded slider in the first position at the low temperatures of the fusible link and a decreased volume to permit movement of the spring-loaded slider into the breakage position at the high temperatures of the fusible link.

2. The arc detection assembly according to claim 1, wherein the first and second terminal ends are engageable in at least one of a pin-and-socket formation and a terminal lug formation.

3. The arc detection assembly according to claim 1, wherein the monitoring circuit comprises:
   a controller configured to identify and interrupt a current causing the arcing condition and to issue a warning that the arcing condition occurred, and
   an electrical device configured to open a circuit carrying the current responsive to an interrupt signal issued by the controller.

4. The arc detection assembly according to claim 1, wherein the monitoring circuit comprises input and output lines routed along and through at least one of the first and second conductors and by which the fusible link and the monitoring circuit are communicative.

5. The arc detection assembly according to claim 1, wherein the monitoring circuit comprises input and output lines routed along an exterior of at least one of the first and second conductors and by which the fusible link and the monitoring circuit are communicative.

6. An arc detection assembly, comprising:
   electrical connection elements, each comprising first and second conductors comprising first and second terminal ends, respectively, which are engageable to form an electrical connection; and
   an arc detection system comprising:
   fusible links disposed proximate to one of the first and second terminal ends of each electrical connection element and configured to break in response to an arcing condition between the corresponding first and second terminal ends;
   a monitoring circuit coupled to the fusible links and configured to determine when breakage of any of the fusible links occurs and to thereby determine that the arcing condition has occurred; and
   input and output line circuitry routed along at least one of the first and second conductors of each electrical connection element and by which each fusible link and the monitoring circuit are communicative,
   the fusible link comprising a cut-off fuse, wherein, at low temperatures of the fusible link below temperatures associated with the arcing condition, the cut-off fuse permits electrical conduction, and, at high temperatures of the fusible link above the temperatures associated with the arcing condition, breakage of the cut-off fuse prevents the electrical conduction, and
   wherein the cut-off fuse comprises:
   a spring-loaded slider to assume one of a first position at which the electrical conduction is permitted and a breakage position at which the electrical conduction is prevented; and
   a thermal pallet formed of material having a large initial volume to normally maintain the spring-loaded slider in the first position at the low temperatures of the fusible link and a decreased volume to permit movement of the spring-loaded slider into the breakage position at the high temperatures of the fusible link.

7. The arc detection assembly according to claim 6, wherein the first and second terminal ends in at least one of the electrical connection elements are engageable in at least one of a pin-and-socket formation and a terminal lug formation.

8. The arc detection assembly according to claim 6, wherein the monitoring circuit comprises:
a controller configured to identify and interrupt a current causing the arc and to issue a warning that the arc occurred, and
an electrical device configured to open a circuit carrying the current responsive to an interrupt signal issued by the controller.

9. The arc detection assembly according to claim 6, wherein the input and output line circuitry is routed along and through the at least one of the first and second conductors or along an exterior of the at least one of the first and second conductors.

10. An arc detection assembly, comprising:
electrical connection elements, each comprising first and second conductors comprising first and second terminal ends, respectively, which are engageable to form an electrical connection; and
an arc detection system comprising:
fusible links disposed proximate to one of the first and second terminal ends of each electrical connection element and configured to break in response to an arcing condition between the corresponding first and second terminal ends; and
a monitoring circuit coupled to the fusible links and configured to determine when breakage of any of the fusible links occurs and to thereby determine that the arcing condition has occurred,
the fusible link comprising a cut-off fuse, wherein, at low temperatures of the fusible link below temperatures associated with the arcing condition, the cut-off fuse permits electrical conduction, and, at high temperatures of the fusible link above the temperatures associated with the arcing condition, breakage of the cut-off fuse prevents the electrical conduction, and
wherein the cut-off fuse comprises:
a spring-loaded slider to assume one of a first position at which the electrical conduction is permitted and a breakage position at which the electrical conduction is prevented; and
a thermal pallet formed of material having a large initial volume to normally maintain the spring-loaded slider in the first position at the low temperatures of the fusible link and a decreased volume to permit movement of the spring-loaded slider into the breakage position at the high temperatures of the fusible link.

11. The arc detection assembly according to claim 10, wherein the first and second terminal ends in at least one of the electrical connection elements are engageable in at least one of a pin-and-socket formation and a terminal lug formation.

12. The arc detection assembly according to claim 10, wherein the monitoring circuit comprises:
a controller configured to identify and interrupt a current causing the arcing condition and to issue a warning that the arcing condition occurred, and
an electrical device configured to open a circuit carrying the current responsive to an interrupt signal issued by the controller.

13. The arc detection assembly according to claim 10, wherein:
the arc detection system further comprises input and output line circuitry connected to each of the fusible links, and
the input and output line circuitry comprising input and output lines connected to each of the fusible links and routed along at least one of the corresponding first and second conductors.

14. The arc detection assembly according to claim 13, wherein each of the fusible links is communicative with a same channel of the monitoring circuit by way of the corresponding input and output lines.

\* \* \* \* \*